(12) United States Patent
De Muer et al.

(10) Patent No.: US 12,061,858 B1
(45) Date of Patent: Aug. 13, 2024

(54) METHOD AND SYSTEM FOR DETERMINING INITIAL MESH FOR CONDUCTOR IN ELECTRONIC CIRCUIT DESIGN

(71) Applicant: Keysight Technologies, Inc., Santa Rosa, CA (US)

(72) Inventors: Tom Gaston Anna De Muer, West Vlaanderen (BE); Marijana Krivić, West Vlaanderen (BE); Michiel Aline Daniël De Wilde, West Vlaanderen (BE); Timotheus Elisabeth René Boonen, West Vlaanderen (BE); Filip Jan Eduard Frans Demuynck, West Vlaanderen (BE)

(73) Assignee: KEYSIGHT TECHNOLOGIES, INC., Santa Rosa, CA (US)

( * ) Notice: Subject to any disclaimer, the term of this patent is extended or adjusted under 35 U.S.C. 154(b) by 416 days.

(21) Appl. No.: 17/486,393

(22) Filed: Sep. 27, 2021

(51) Int. Cl.
G06F 30/39 (2020.01)
G06F 30/398 (2020.01)
H01B 13/00 (2006.01)

(52) U.S. Cl.
CPC ....... *G06F 30/398* (2020.01); *H01B 13/0036* (2013.01)

(58) Field of Classification Search
CPC ........ G06F 30/30; G06F 30/39; G06F 30/392; G06F 30/394; G06F 30/398; H01B 13/0036
USPC .......................................................... 716/106
See application file for complete search history.

(56) References Cited

U.S. PATENT DOCUMENTS

2007/0245275 A1* 10/2007 Jandhyala ............. G06F 30/398
716/55

* cited by examiner

Primary Examiner — Paul Dinh

(57) ABSTRACT

A method determines an initial mesh for a conductor in an electronic circuit design to enable more efficient simulation of electro-magnetic properties of the conductor. The method includes parsing a three-dimensional representation of a conductor as multiple vertices of a closed polygon, each vertex joining corresponding edges of the polygon; obtaining a straight skeleton of the conductor by moving the edges inwardly toward a center of the polygon at a constant speed in a self-parallel manner; determining widths of the conductor at multiple points along the straight skeleton as a function of the edges moving inwardly at the constant speed; constructing a backbone of the conductor, including registering the widths of the conductor along the conductor backbone; providing mesh cells on the conductor backbone using predetermined scaling factors of the registered widths of the conductor backbone; and generating the initial mesh for the conductor based on the mesh cells.

20 Claims, 6 Drawing Sheets

METHOD AND SYSTEM FOR DETERMINING INITIAL MESH FOR CONDUCTOR IN ELECTRONIC CIRCUIT DESIGN

BACKGROUND

Three-dimensional (3D) electro-magnetic solvers are used for designing electrical circuits. The 3D electro-magnetic solvers commonly incorporate a finite-element method (FEM) technique to solve design problems with complex 3D geometry. An important step of the FEM technique is finding a mesh (discretization) of each conductor in the electrical circuit that adequately represents the 3D geometry, enabling accurate simulation of electro-magnetic properties of the conductor. In order to find an adequate final mesh, an initial mesh for the conductor is generated, and adaptively refined to arrive at a final converged solution for the final mesh. When the initial mesh is incorrect, the converged solution may fail or may otherwise take prohibitively long to obtain. Accordingly, generating an initial mesh that is as close as possible to the final mesh greatly improves simulation performance and the eventual accuracy of the 3D electro-magnetic design model.

However, conventional techniques rely on meshing based on wavelength criteria, where the maximum mesh size is limited by a predetermined fraction of a wavelength used in the simulation. In these techniques, the initial mesh is applied blindly across of whole design, limiting its usefulness. For example, conventional techniques identifying structures that should be meshed relatively finer rely on information regarding where a simulation port enters the design. Such techniques fail to capture the broad set of situations encountered through the design where the FEM technique is applied. For example, a conductor (signal trace) of a particular design may propagate from the printed circuit board (PCB) level all the way to integrated circuit (IC) ports, changing widths multiple times along the way. The conventional techniques attempt to base mesh density on estimated local widths of the conductor perpendicular to the direction of where currents are likely to start flowing. However, estimating the local width is done by randomized ray-shooting, which often fails to find a good estimation of the true physical width. Also, the width is assumed to be constant throughout the complete structure of the conductor, which often is not the case. Initial meshes provided by such techniques generally are not close enough to the final mesh to ensure accurate results from the simulation, and/or otherwise require substantial time and processing resources.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
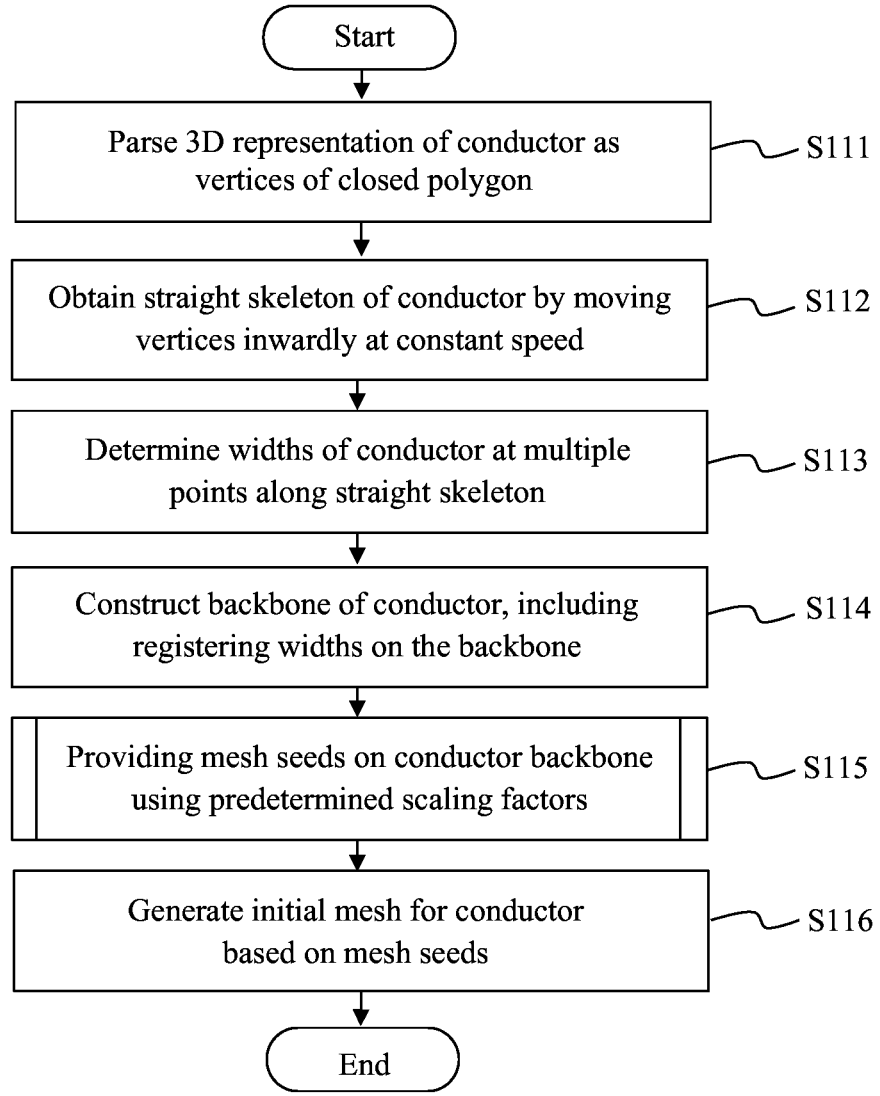
FIG. 1 is a simplified flow diagram showing a method of determining an initial mesh for a conductor in an electronic circuit design, according to a representative embodiment.

In the following detailed description, for purposes of explanation and not limitation, representative embodiments disclosing specific details are set forth in order to provide a thorough understanding of an embodiment according to the present teachings. Descriptions of known systems, devices, materials, methods of operation and methods of manufacture may be omitted so as to avoid obscuring the description of the representative embodiments. Nonetheless, systems, devices, materials and methods that are within the purview of one of ordinary skill in the art are within the scope of the present teachings and may be used in accordance with the representative embodiments. It is to be understood that the terminology used herein is for purposes of describing particular embodiments only and is not intended to be limiting. The defined terms are in addition to the technical and scientific meanings of the defined terms as commonly understood and accepted in the technical field of the present teachings.

It will be understood that, although the terms first, second, third etc. may be used herein to describe various elements or components, these elements or components should not be limited by these terms. These terms are only used to distinguish one element or component from another element or component. Thus, a first element or component discussed below could be termed a second element or component without departing from the teachings of the present disclosure.

The terminology used herein is for purposes of describing particular embodiments only and is not intended to be limiting. As used in the specification and appended claims, the singular forms of terms "a," "an" and "the" are intended to include both singular and plural forms, unless the context clearly dictates otherwise. Additionally, the terms "comprises," and/or "comprising," and/or similar terms when used in this specification, specify the presence of stated features, elements, and/or components, but do not preclude the presence or addition of one or more other features, elements, components, and/or groups thereof. As used herein, the term "and/or" includes any and all combinations of one or more of the associated listed items.

Unless otherwise noted, when an element or component is said to be "connected to," "coupled to," or "adjacent to" another element or component, it will be understood that the element or component can be directly connected or coupled to the other element or component, or intervening elements or components may be present. That is, these and similar terms encompass cases where one or more intermediate elements or components may be employed to connect two elements or components. However, when an element or component is said to be "directly connected" to another element or component, this encompasses only cases where the two elements or components are connected to each other without any intermediate or intervening elements or components.

The present disclosure, through one or more of its various aspects, embodiments and/or specific features or sub-components, is thus intended to bring out one or more of the advantages as specifically noted below. For purposes of explanation and not limitation, example embodiments disclosing specific details are set forth in order to provide a thorough understanding of an embodiment according to the present teachings. However, other embodiments consistent with the present disclosure that depart from specific details disclosed herein remain within the scope of the appended claims. Moreover, descriptions of well-known apparatuses and methods may be omitted so as to not obscure the description of the example embodiments. Such methods and apparatuses are within the scope of the present disclosure.

According to various embodiments, the width of a conductor in a model of an electronic circuit design is estimated on the whole structure of the conductor, so there is no need to have a physical starting point on the conductor for the width estimation. Also, the width estimation is local, which provides a better starting point for determining the initial mesh of the model that needs to be produced locally to model the electrical fields surrounding the conductor.

According to a representative embodiment, a method is provided for determining an initial mesh for a conductor in a model of an electronic circuit design to enable more efficient simulation of electro-magnetic properties of the conductor. The method includes parsing a three-dimensional representation of a conductor as multiple vertices of a closed polygon, each vertex joining corresponding edges of the polygon; obtaining a straight skeleton of the conductor by moving the edges inwardly toward a center of the polygon at a constant speed in a self-parallel manner, where the straight skeleton is a topological polygon representation of the conductor; determining widths of the conductor at multiple points along the straight skeleton as a function of the edges moving inwardly at the constant speed; constructing a backbone of the conductor, including registering the widths of the conductor along the conductor backbone; providing mesh cells on the conductor backbone using predetermined scaling factors of the registered widths of the conductor backbone; and generating the initial mesh for the conductor based on the mesh cells.

According to another representative embodiment, a system is provided for determining an initial mesh for a conductor in a model of an electronic circuit design to enable more efficient simulation of electro-magnetic properties of the conductor. The system includes a processing unit and a memory for storing instructions that, when executed by the processing unit, cause the processing unit to parse a three-dimensional representation of a conductor as multiple vertices of a closed polygon, each vertex joining corresponding edges of the polygon; obtain a straight skeleton of the conductor by moving the edges inwardly toward a center of the polygon at a constant speed in a self-parallel manner, where the straight skeleton is a topological polygon representation of the conductor; determine widths of the conductor at multiple points along the straight skeleton as a function of the edges moving inwardly at the constant speed; construct a backbone of the conductor, including registering the widths of the conductor along the conductor backbone; provide mesh cells on the conductor backbone using predetermined scaling factors of the registered widths of the conductor backbone; and generate the initial mesh for the conductor based on the mesh cells.

According to another representative embodiment, a non-transitory computer readable medium is provided that stores instructions for determining an initial mesh for a conductor in a model of an electronic circuit design to enable more efficient simulation of electro-magnetic properties of the conductor. When executed by one or more processors, the instructions cause the one or more processors to parse a three-dimensional representation of a conductor as multiple vertices of a closed polygon, each vertex joining corresponding edges of the polygon; obtain a straight skeleton of the conductor by moving the edges inwardly toward a center of the polygon at a constant speed in a self-parallel manner, where the straight skeleton is a topological polygon representation of the conductor; determine widths of the conductor at multiple points along the straight skeleton as a function of the edges moving inwardly at the constant speed; construct a backbone of the conductor, including registering the widths of the conductor along the conductor backbone; provide mesh cells on the conductor backbone using predetermined scaling factors of the registered widths of the conductor backbone; and generate the initial mesh for the conductor based on the mesh cells.

FIG. 1 is a simplified flow diagram illustrating a method of determining an initial mesh for a conductor in a model of an electronic circuit design, according to a representative embodiment. The initial mesh accurately represents the structure of the conductor, enabling more efficient simulation of electro-magnetic properties of the conductor based on a particular design. The method may be implemented using a computer, such as computer workstation 605, for example, discussed below with reference to FIG. 6, where the method steps are provided as instructions stored in memory 620 and executable by the processing unit 610.

Figure 2:
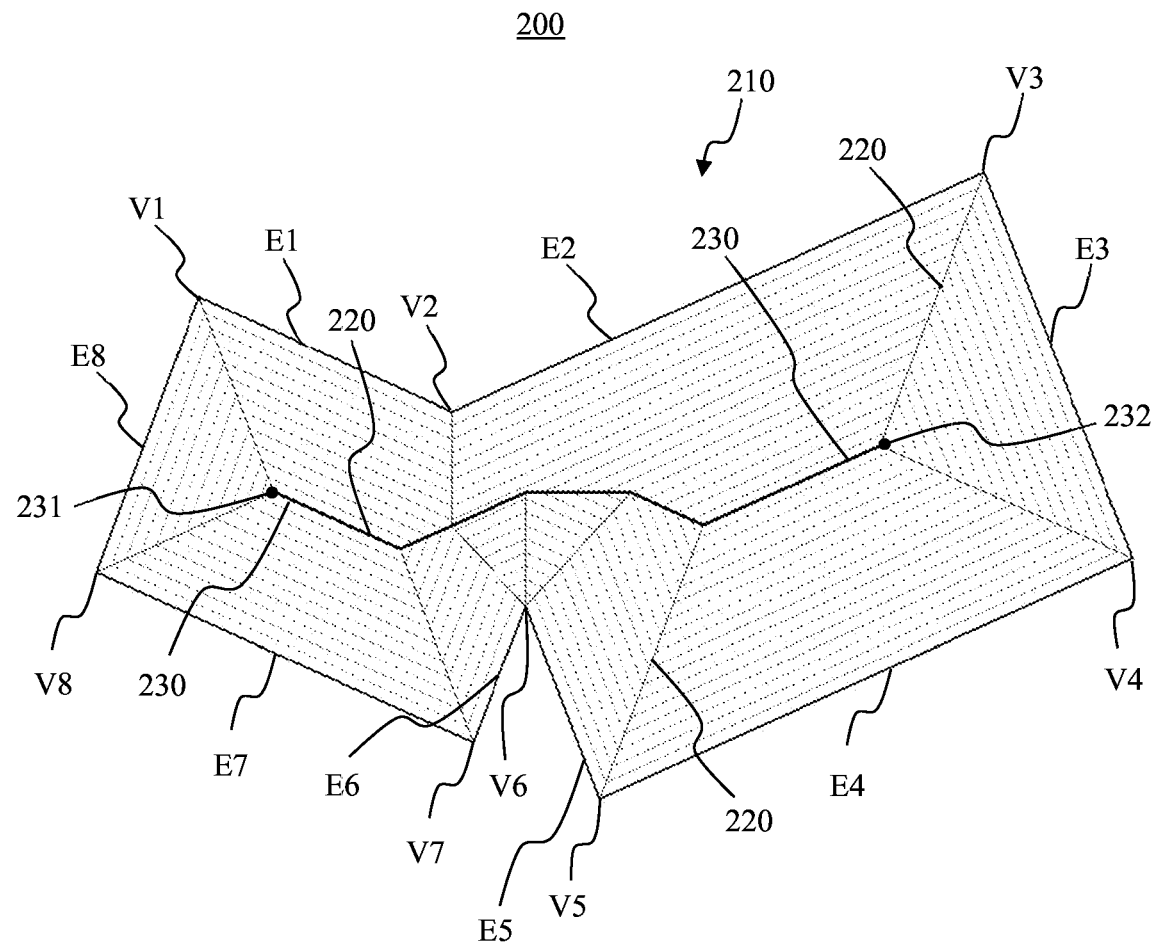
FIG. 2 shows an illustrative conductor for which an initial mesh is to be derived, according to a representative embodiment.

The conductor itself may be part of an electronic circuit that is in the design process, where a simulation is to be run on the electronic circuit for identifying electro-magnetic properties. The design of the electronic circuit is defined by the conductors, and may be provided by an automated circuit design product, such as Keysight PathWave Advanced Design System, available from Keysight Technologies, Inc., for example, as would be apparent to one skilled in the art. For purposes of illustration and not limitation, FIG. 2 shows an illustrative conductor 200 for which an initial mesh is derived, according to a representative embodiment. It is understood, however, that the size and shape of the conductor may vary, without departing from the scope of the present teachings.

Referring to FIGS. 1 and 2, the method includes parsing a three-dimensional representation of a conductor as multiple vertices of a closed polygon in block S111. Each vertex of the multiple vertices joins corresponding edges of the polygon. For example, in FIG. 2, the conductor 200 is parsed into vertices V1-V8 located at respective corners of closed polygon 210. Adjacent edges E1-E8 are joined by the vertices V1-V8, respectively.

In block S112, the straight skeleton 220 of the conductor 200 is obtained by a simulated shrinking process of the polygon 210. During this process, the edges E1-E8 are being moved inwardly at a constant speed in a self-parallel manner. This is shown in FIG. 2 by the multiple lines parallel to each edge E1-E8 indicating arbitrary intermediate positions of each edge E1-E8 as they move inwardly. The straight skeleton 220 is the graph traced by the endpoints joining the edges (initially vertices V1-V8) as they move during this shrinking process. The inward motion of the edges E1-E8 continues until they all have run into an opposing edge. Depending on the shape of the polygon 210, some moved edges may effectively disappear as their lengths become zero (e.g., edges E3 and E8). At that time, there will be a new pair of now-adjoining moved edges that "meet" defining a new combined vertex, which ultimately comes together with another combined vertex the shrinking process completes. The straight skeleton 220 is a topological polygon representation of the conductor 200.

In block S113, widths of the conductor 200 are annotated at all corners of the straight skeleton 220 as a function of the respective distances traveled by edges E1-E8. That is, a pair of edges that defines a portion of the conductor 200 that is relatively wide (e.g., edges E2 and E4) will take a longer time for the edges to meet to define the straight skeleton 220 while moving inwardly at the constant speed than the time it takes for edges to meet of a pair of edges that defines another portion of the conductor 200 that is relatively narrow (e.g., edges E1 and E7). These times correlate to widths of the conductor 200. The width at any point inside an edge of the straight skeleton 220 can be linearly interpolated from the endpoints of the edge in the straight skeleton 220. The widths effectively provide the distance from each point along the straight skeleton 220 to the nearest edge of the polygon 210.

In block S114, a backbone 230 of the conductor 200 is constructed. Constructing the conductor backbone 230 includes registering the widths of the conductor 200 to the backbone 230 at backbone points corresponding to the points along the straight skeleton 220, as determined in block S113. The backbone 230 is a trace that follows the conductor 200 from a start point 231 to an end point 232 along a connected subgraph of the straight skeleton 220, as indicated by the bold line in FIG. 2. That is, the backbone 230 for the polygon 210 consists of a subset of corners (vertices) and edges of the entire straight skeleton 220. The backbone 230 is constructed by reducing the entire straight skeleton 220 by repeated removal of the outermost dangling edges corresponding to original edges that are less than a configurable threshold angle opposite each other (e.g., edges E2 and E3). The widths of the conductor 200 are annotated to the vertices of the backbone 230 by copying them from the straight skeleton 220.

In an embodiment, vertices parsed in block S111 that join corresponding edges intersecting under an acute reflex angle (less than 90 degrees), such as vertex V6 joining edges E5 and E6 in FIG. 2, may create straight skeleton vertices that move undesirably fast compared to the movement of both edges joined by these vertices. This leads to an inaccurate width assessment of the conductor 200. To avoid this, the method of determining the initial mesh may optionally include identifying each vertex of the polygon 210 with corresponding edges that intersect under an acute reflex angle before moving the edges inwardly toward the center of the polygon 210 at the constant speed in block S112, and splitting each identified vertex into a set of two or more closely spaced working vertices, connected by extra initially zero length edges that abut the acute corner. These degenerate edges lengthen and become regular edges as the polygon shrinks. For example, obtaining the straight skeleton 220 in block S112 uses two such extra zero length edges at V6. This effectively eliminates the fast moving vertex and the associated inaccuracy of the width assessment.

Block S115 depicts a process in which mesh cells of a mesh are provided on the backbone 230 using predetermined scaling factors of the registered widths of the backbone 230. An example of this process is discussed below with reference to FIG. 5. Granularity of the mesh (i.e., mesh length of the mesh cells) at each backbone point is determined based on the width of the conductor 200 at that backbone point. Generally, the scaling factor is smaller for narrower widths to provide finer mesh cells, and larger for wider widths to provide coarser mesh cells, in order to provide an initial mesh for simulating electrical performance of the conductor 200. For example, the scaling factor for the narrower widths may be a fraction of the width (e.g., one fifth) at the corresponding backbone point, while the scaling factor for the wider widths may be a larger fraction of the width (e.g., one half) or a multiple of the width (e.g., two times) at the corresponding backbone point, as discussed further below. Finer and coarser meshes are understood to be relative terms that vary depending on the dimensions of the conductor. For purposes of illustration and not limitation, a finer mesh may have mesh cells with mesh lengths between about 1/10 to about 1/2 of the locally observed width, and a coarser mesh may have mesh cells with mesh lengths between about 1/2 of to about 4 times the locally observed width.

Generally, the finer mesh (shorter mesh lengths) is preferable to the extent it captures more detail, and is therefore more likely to provide an initial mesh of the conductor 200 from which a correct mesh is ultimately created. However, implementation and processing of the finer mesh requires substantially more computational effort than the coarser mesh (longer mesh lengths). So, at wider portions of the conductor 200, use of the finer mesh becomes computationally prohibitive, which is why the large scaling factor, and thus coarser mesh, is desirable for these locations. In other words, the size of the mesh cells is a tradeoff between chances of creating a correct mesh from the initial mesh and risks of over-meshing the conductor 200. Thus, block S115 provides an appropriately fine or coarse mesh at different parts of the conductor 200 having different widths to balance these considerations. In comparison, conventional processes provide mesh cells of all the same length regardless of the width of the conductor at different locations. Therefore, the user must choose between a finer mesh to accommodate the narrower portions of the conductor, but sacrificing efficiency in the simulation of the wider portions of the conductor, or a coarse mesh to accommodate the wider portions of the conductor, but sacrificing accuracy in the simulation of the narrower portions.

Figure 3A:
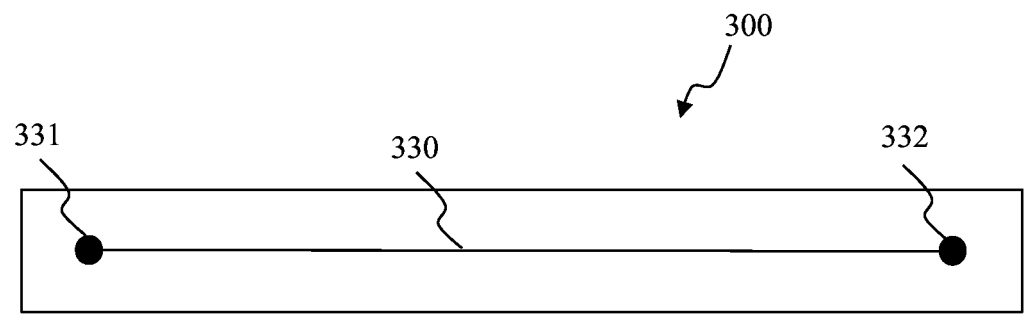
FIG. 3A shows a backbone of an illustrative conductor for which an initial mesh is to be derived, according to a representative embodiment.
Figure 3B:
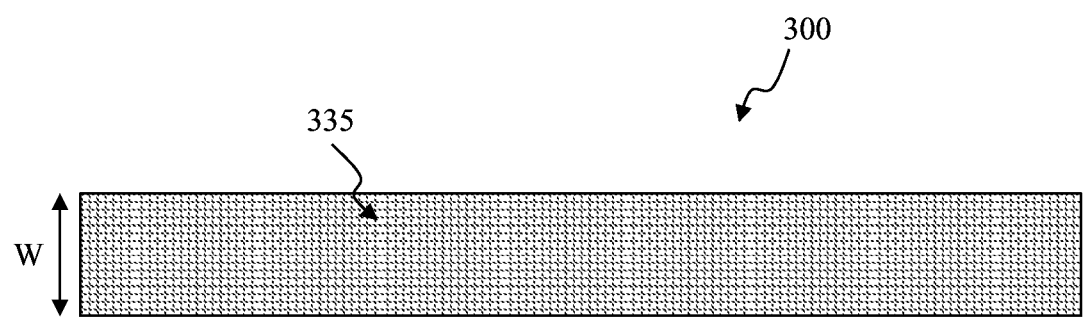
FIG. 3B shows meshing on the backbone of the illustrative conductor, according to a representative embodiment.

FIG. 3A shows a backbone of an illustrative conductor for which an initial mesh is to be derived, and FIG. 3B shows meshing on the backbone of the illustrative conductor, according to a representative embodiment.

FIG. 3A shows a conductor 300, which may be a simple microstrip for purposes of illustration. A backbone 330 of the conductor 300 has been constructed in accordance with blocks S111-S114 of FIG. 1, for example, described above. The backbone 330 extends between a start point 331 and an end point 332, and a width W of the conductor 300 is registered at at least the start point 331 and the end point 332.

FIG. 3B shows fine mesh cells 335 for the conductor 300 created by the meshing process using the width W in accordance with block SD115 of FIG. 1. The meshing process builds the mesh cell size of the initial mesh based on a configurable, predetermined scaling factor of the width W of the conductor 300. In the depicted example, the mesh length of each of the mesh cells 335 is a fraction of the width W of the conductor 300, such as one fifth of the width W (W/5), which leads to five mesh cells across the width W of the conductor 300. That is, the scaling factor of one fifth the width W is applied to determine the mesh length of the mesh cells. This is based on the fact that, across the width W, an approximation of the current pattern needs to be matched that requires a finer mesh near the edges of the conductor 300. Of course, the scaling factor may vary to provide unique benefits for any particular situation or to meet application specific design requirements of various implementations, as would be apparent to one skilled in the art. For example, in the case of conductors having uniformly distributed current (such as those used as power and ground traces), there is no need for a fine mesh, so the predetermined scaling factor may be set to a coarser value, such as half the width W (W/2) or two times the width W (2 W), for example.

The backbone 330 extends between a start point 331 and an end point 332, and a width W of the conductor 300 is registered at at least the start point 331 and the end point 332.

Figure 4A:
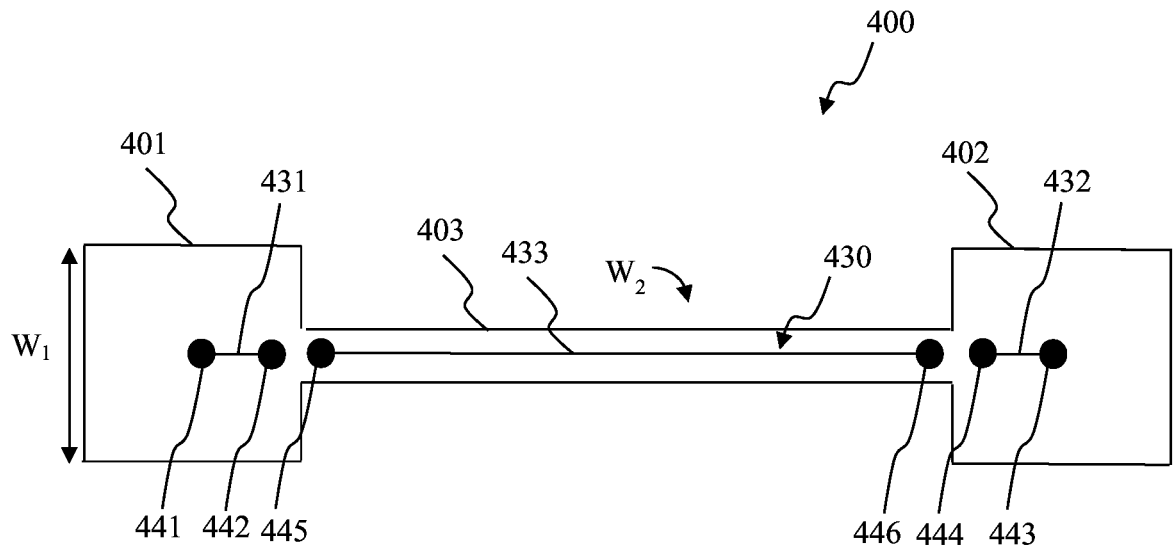
FIG. 4A shows a backbone of another illustrative conductor for which an initial mesh is to be derived, according to a representative embodiment.
Figure 4B:
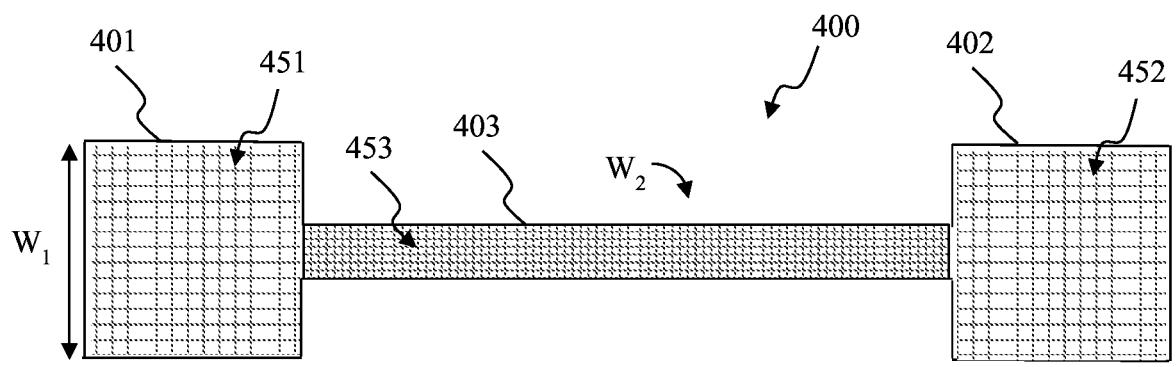
FIG. 4B shows meshing on the backbone of the illustrative conductor, according to a representative embodiment.

FIG. 4A shows a backbone of another illustrative conductor for which an initial mesh is to be derived, and FIG. 4B shows meshing on the backbone of the illustrative conductor, according to a representative embodiment.

FIG. 4A shows a conductor 400, which includes different widths making it more complex to accurately estimate an initial mesh for simulating electro-magnetic properties than the conductor 300. The conductor 400 includes a wide first pad 401, a wide second pad 402, and a thin microstrip 403 connecting the first and second pads 401 and 402. A backbone 430 of the conductor 400 includes a first backbone portion 431 across the first pad 411, a second backbone portion 432 across the second pad 412, and a third backbone portion 433 across the microstrip 403, each of which has been constructed in accordance with blocks S111-S114 of FIG. 1, for example. The first backbone portion 431 extends between a start point 441 and a residue point 442, and a width $W_1$ is registered at at least the start point 441 and the residue point 442. The second backbone portion 432 extends between a start point 443 and a residue point 444, and the width $W_1$ is registered at at least the start point 443 and the residue point 444. The third backbone portion 433 extends between a start point 445 and an end point 446, and a width $W_2$ is registered at at least the start point 445 and the end point 446.

FIG. 4B shows coarse mesh cells 451 and 452 for the first and second pads 401 and 402, respectively, created by the meshing process using the width $W_1$, and fine mesh cells 453 for the microstrip 403, created by the meshing process using the width $W_2$, in accordance with block S115 of FIG. 1. The meshing process builds the mesh cell size of the initial mesh based on a coarse predetermined scaling factor of the width $W_1$ of the first and second pads 401 and 402, and based on a fine predetermined scaling factor of the width $W_2$ of the microstrip 403. In the depicted example, the coarse scaling factor for the wider first and second pads 401 and 402 may be $W_1/2$ or $2 W_1$, for example, and the fine scaling factor for the narrower microstrip 403 may be $W_2/5$, for example, as discussed above. Again, the respective scaling factors may vary to provide unique benefits for any particular situation or to meet application specific design requirements of various implementations, as would be apparent to one skilled in the art.

In an embodiment, the granularity of the mesh at the backbone points may be determined in block S115 based, at least in part, on design markings on the conductor itself. Such design markings are well known, are routinely provided as part of the conductor design process, and are saved in association with other design parameters. For example, the design software may have a rule system based on the name of the conductor to determine the most likely role of the conductor. The user may override such design markings after visual inspection, if needed. Markings may be referred to as mesh hints or may be defined as such. In this context, FIG. 5 is a simplified flow diagram illustrating a method determining mesh granularity based on design markings on the conductor, according to a representative embodiment.

Figure 5:
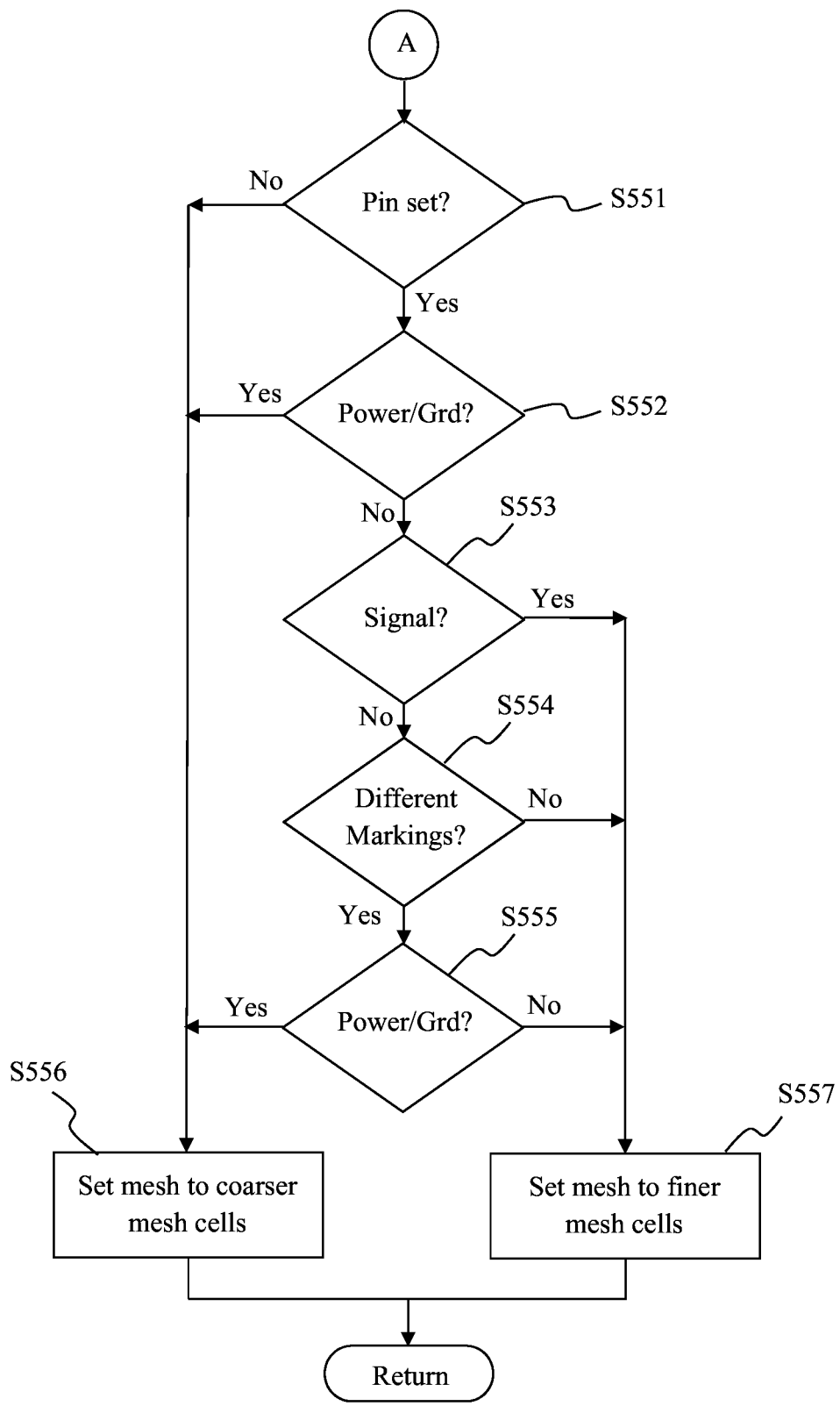
FIG. 5 is a simplified flow diagram illustrating a method determining mesh granularity based on design markings on the conductor, according to a representative embodiment.

Referring to FIG. 5, it is determined at block S551 whether the markings indicate a pin set on the conductor 200, meaning an end point of the circuit of which the conductor 200 is a part. When there is no pin set on the conductor 200 (block S551: No), the mesh of the conductor 200 is set to have coarser mesh cells in block S556. When there is a pin set (block S551: Yes), the process proceeds to block S552, where it is determined whether the conductor 200 is marked as a power or ground conductor. In an embodiment, when there is no pin set on the conductor 200, it may be determined whether the polygon 210 of conductor 200 overlaps another conductor polygon that has a pin set. If so, the polygons and corresponding conductors may be treated as a group having a pin set, where the remaining steps are performed on the group.

When the conductor 200 is marked as a power or ground conductor (block S552: Yes), the mesh of the conductor 200 is set to have the coarser mesh cells in block S556. When the conductor 200 is not marked as a power or ground conductor (block S552: No), the process proceeds to block S553, where it is determined whether the conductor is marked as a signal conductor. When the conductor 200 is marked as a signal conductor (block S553: Yes), the mesh of the conductor 200 is set to have finer mesh cells in block S557.

When the conductor 200 is not marked as a signal ground conductor (block S553: No), it is deemed unassigned. In this case, the process proceeds to block S554, where it is determined whether the conductor 200 has another face that is marked differently. When the conductor 200 does not have another faces, or has another face that is not marked differently (block S554: No), the mesh of the conductor 200 is set to have the finer mesh cells in block S557. When the conductor 200 does have another face that is marked differently (block S554: Yes), the process proceeds to block S555, where it is determined whether the other face is marked as a power or ground conductor. When the other face of the conductor 200 is marked as power or ground (block S555: Yes), the mesh of the conductor 200 is set to have the coarser mesh cells in block S556. When the other face is not marked as a power or ground conductor (block S555: No), the mesh of the conductor 200 is set to have the finer mesh cells in block S557.

Of course, in alternative configurations, the order of the steps in FIG. 5 may be altered without departing from the scope of the present teachings. For example, the order of blocks S552 and S553 may be reversed, and/or block S555 may determine whether the other face is marked as a signal conductor as opposed to a power or ground conductor, or simply identify the type of conductor.

Referring again to FIG. 1, the initial mesh for the conductor is generated in block S116 using a meshing process based on the mesh cells determined in block S115. For example, the initial mesh may be generated using known mesh algorithms that can be guided with mesh hints.

A mesh algorithm takes as input a geometric description, such as polygons, and turns the geometric description into a set of space-filling simplices. A simplex is unit of geometry that can be used later by a solver. In the embodiments described herein, the input of the mesh algorithm is a set of polygons defined in a three-dimensional world, and the output of the mesh algorithm is a set of space-filling tetrahedra. Space-filling means that there is a box in which all space will be filled with tetrahedra. The exact shapes of the tetrahedra are provided by the meshing process. The shapes of the tetrahedra will honor the input geometry plus any mesh hints. The various embodiments use a mesh algorithm, and feed it with intelligent information coming from the backbone 230 to create a mesh that is fit for electronics simulation.

The initial mesh for the conductor may be input to a model or algorithm for automated design of an electrical circuit, thereby improving a final mesh adapted from the initial mesh and ultimately improving the circuit design itself. For example, the initial mesh may be input to a 3D electro-magnetic solver, which incorporates the FEM technique to provide a circuit design that includes the conductor. As discussed above, the initial mesh is adaptively refined to arrive at a final converged solution for a final mesh for the circuit design, which is an improvement over conventionally obtained final meshes.

Figure 6:
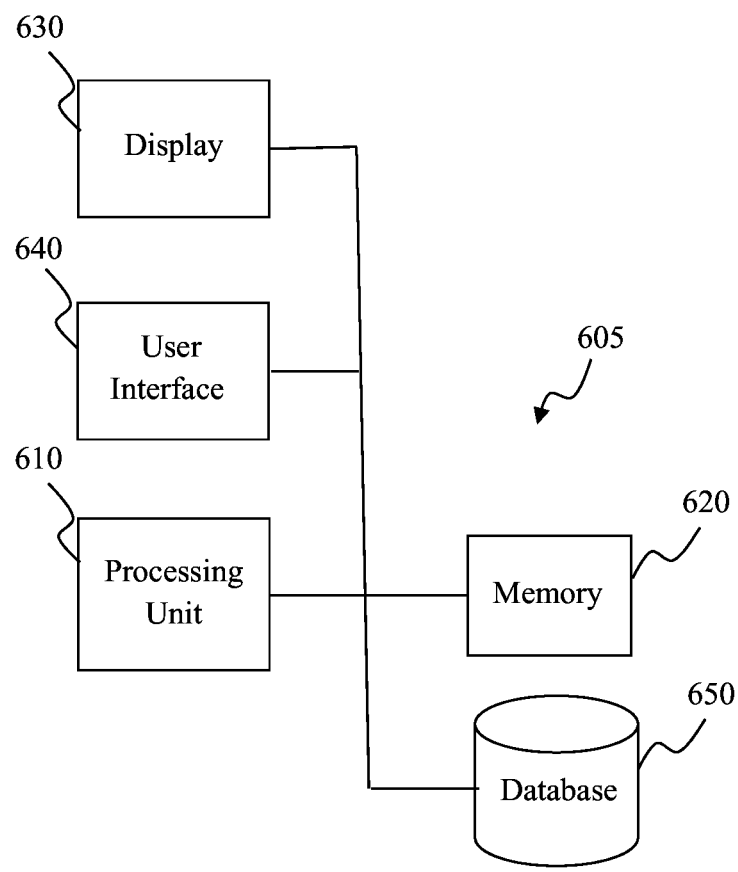
FIG. 6 is a simplified block diagram showing a system for determining an initial mesh for a conductor in an electronic circuit design to enable more efficient simulation of electro-magnetic properties of the conductor, according to a representative embodiment.

FIG. 6 is a simplified block diagram showing a system for determining an initial mesh for a conductor in an electronic circuit design to enable more efficient simulation of electromagnetic properties of the conductor, according to a representative embodiment.

Referring to FIG. 6, a circuit design system 600 includes a computer workstation 605 from which the design process is supervised and/or managed. The computer workstation 605 includes a processing unit 610, memory 620 for storing instructions executable by the processing unit 610 to implement the processes described herein, as well as a display 630 and an interface 640 to enable user (circuit designer) interaction. The computer workstation 605 may further include a database 650 that stores information to be used for determining the initial mesh of the conductor, designing the conductor using the mesh, executing an FEM technique, and the like. The circuit design system 600 may be embodied in a circuit simulator, as would be apparent to one skilled in the art.

The processing unit 610 is representative of one or more processing devices, and is configured to execute software instructions to perform functions as described in the various embodiments herein. The processing unit 610 may be implemented by a general purpose computer, a central processing unit, one or more processors, microprocessors or microcontrollers, a state machine, a programmable logic device, field programmable gate arrays (FPGAs), application specific integrated circuits (ASICs), or combinations thereof, using any combination of hardware, software, firmware, hardwired logic circuits, or combinations thereof. The term "processor," in particular, encompasses an electronic component able to execute a program or machine executable instructions. References to "a processor" should be interpreted to include more than one processor or processing core, as in a multi-core processor, and/or parallel processors. A processor may also refer to a collection of processors within a single computer system or distributed among multiple computer systems, such as in a cloud-based or other multi-site application. Programs have software instructions performed by one or multiple processors that may be within the same computing device or which may be distributed across multiple computing devices.

The memory 620 may include a main memory and/or a static memory, where such memories may communicate with each other and the processing unit 610 via one or more buses. The memory 620 stores instructions used to implement some or all aspects of methods and processes described herein, including the methods described above with reference to FIGS. 1 and 5, for example. The memory 620 may be implemented by any number, type and combination of random access memory (RAM) and read-only memory (ROM), for example, and may store various types of information, such as software algorithms, data based models including ANN and other neural network based models, and computer programs, all of which are executable by the processing unit 610. The various types of ROM and RAM may include any number, type and combination of computer readable storage media, such as a disk drive, flash memory, an electrically programmable read-only memory (EPROM), an electrically erasable and programmable read only memory (EEPROM), registers, a hard disk, a removable disk, tape, compact disk read only memory (CD-ROM), digital versatile disk (DVD), floppy disk, blu-ray disk, a universal serial bus (USB) drive, or any other form of storage medium known in the art.

The memory 620 is a tangible storage medium for storing data and executable software instructions, and is non-transitory during the time software instructions are stored therein. As used herein, the term "non-transitory" is to be interpreted not as an eternal characteristic of a state, but as a characteristic of a state that will last for a period. The term "non-transitory" specifically disavows fleeting characteristics such as characteristics of a carrier wave or signal or other forms that exist only transitorily in any place at any time. The memory 620 may store software instructions and/or computer readable code that enable performance of various functions. The memory 620 may be secure and/or encrypted, or unsecure and/or unencrypted.

Similarly, the database 650 stores data and instructions used to implement some or all aspects of methods and processes described herein. The database 650 may be implemented by any number, type and combination of RAM and ROM, for example, and may store various types of information, such as software algorithms, data based models including ANN and other neural network based models, and computer programs, all of which are executable by the processing unit 610. The various types of ROM and RAM may include any number, type and combination of computer readable storage media, such as a disk drive, flash memory, EPROM, EEPROM, registers, a hard disk, a removable disk, tape, CD-ROM, DVD, floppy disk, blu-ray disk, USB drive, or any other form of storage medium known in the art. The database 650 likewise is a tangible storage medium for storing data and executable software instructions, and is non-transitory during the time software instructions are stored therein. The database 650 may be secure and/or encrypted, or unsecure and/or unencrypted.

The display 630 may be a monitor such as a computer monitor, a television, a liquid crystal display (LCD), an organic light emitting diode (OLED), a flat panel display, a solid-state display, or a cathode ray tube (CRT) display, or an electronic whiteboard, for example. The display 630 may also provide a graphical user interface (GUI) for displaying and receiving information to and from the user.

The interface 640 may include a user and/or network interface for providing information and data output by the processing unit 610 and/or the memory 620 to the user and/or for receiving information and data input by the user. That is, the interface 640 enables the user to enter data and to control or manipulate aspects of the processes described herein, and also enables the processing unit 610 to indicate the effects of the user's control or manipulation. The interface 640 may connect one or more user interfaces, such as a mouse, a keyboard, a mouse, a trackball, a joystick, a haptic device, a microphone, a video camera, a touchpad, a touchscreen, voice or gesture recognition captured by a microphone or video camera, for example, or any other peripheral or control to permit user feedback from and interaction with the computer workstation 605. The interface 640 may further include one or more of ports, disk drives, wireless antennas, or other types of receiver circuitry.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those having ordinary skill in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to an advantage.

Aspects of the present invention may be embodied as an apparatus, method or computer program product. Accordingly, aspects of the present invention may take the form of an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

The invention claimed is:

1. A method of determining an initial mesh for a conductor in a model of an electronic circuit design to enable more efficient simulation of electro-magnetic properties of the conductor, the method comprising:
    parsing a three-dimensional representation of the conductor as a plurality of vertices of a closed polygon, each vertex joining corresponding edges of the polygon;
    obtaining a straight skeleton of the conductor by moving the edges inwardly toward a center of the polygon at a constant speed in a self-parallel manner, wherein the straight skeleton is a topological polygon representation of the conductor;
    determining widths of the conductor at a plurality of points along the straight skeleton as a function of the edges moving inwardly at the constant speed;
    constructing a backbone of the conductor, including registering the widths of the conductor along the conductor backbone;
    providing mesh cells on the conductor backbone using predetermined scaling factors of the registered widths of the conductor backbone; and
    generating the initial mesh for the conductor based on the mesh cells.

2. The method of claim 1, further comprising:
    before moving the edges inwardly toward the center of the polygon, identifying vertices with corresponding edges that intersect under an acute reflex angle; and
    splitting the identified vertices into sets of two or more closely spaced working vertices connected by initially zero length edges abutting the acute reflex angle, respectively, to avoid creating points along the straight skeleton where widths of the conductor at the points are inaccurate.

3. The method of claim 2, wherein obtaining the straight skeleton of the conductor comprises initially setting each of the corresponding edges that intersects under the acute reflex angle to an infinitesimal edge.

4. The method of claim 1, wherein providing the mesh cells on the conductor backbone comprises:
    setting the mesh cells to a coarse value when a pin set is not on the conductor;
    setting the mesh cells to the coarse value when the conductor is marked as a power/ground conductor; and
    setting the mesh cells to a fine value when the conductor is marked as a signal conductor.

5. The method of claim 4, wherein the coarse value is about two times the determined width of the conductor, and wherein the fine value is about one fifth of the determined width of the conductor.

6. The method of claim 4, wherein when the conductor is unassigned and has no other face that is differently marked, providing the mesh cells on the conductor backbone further comprises setting the mesh cells to the fine value.

7. The method of claim 4, wherein when the conductor is unassigned and has another face that is differently marked, providing the mesh cells on the conductor backbone further comprises:
    setting the mesh cells to the coarse value when the differently marked face is marked as a power/ground conductor; and
    setting the mesh cells to the fine value when the differently marked face is marked as a signal conductor.

8. A system for determining an initial mesh for a conductor in a model of an electronic circuit design to enable more efficient simulation of electro-magnetic properties of the conductor, the system comprising:
    a processing unit; and
    a memory for storing instructions that, when executed by the processing unit, cause the processing unit to:
    parse a three-dimensional representation of the conductor as a plurality of vertices of a closed polygon, each vertex joining corresponding edges of the polygon;
    obtain a straight skeleton of the conductor by moving the edges inwardly toward a center of the polygon at a constant speed in a self-parallel manner, wherein the straight skeleton is a topological polygon representation of the conductor;
    determine widths of the conductor at a plurality of points along the straight skeleton as a function of the edges moving inwardly at the constant speed;
    construct a backbone of the conductor, including registering the widths of the conductor along the conductor backbone;
    provide mesh cells on the conductor backbone using predetermined scaling factors of the registered widths of the conductor backbone; and
    generate the initial mesh for the conductor based on the mesh cells.

9. The system of claim 8, wherein the instructions further cause the processing unit to:

identify vertices with corresponding edges that intersect under an acute reflex angle before moving the edges inwardly toward the center of the polygon; and split the identified vertices into sets of two or more closely spaced working vertices connected by an initially zero length edge abutting the acute reflex angle, respectively, to avoid creating points along the straight skeleton where widths of the conductor at the points are inaccurate.

10. The system of claim 9, wherein obtaining the straight skeleton of the conductor comprises initially setting each of the corresponding edges that intersects under the acute reflex angle to an infinitesimal edge.

11. The system of claim 8, wherein the instructions cause the processing unit to provide the mesh cells on the conductor backbone by:

setting the mesh cells to a coarse value when a pin set is not on the conductor;

setting the mesh cells to the coarse value when the conductor is marked as a power/ground conductor; and setting the mesh cells to a fine value when the conductor is marked as a signal conductor.

12. The system of claim 11, wherein the coarse value is about two times the determined width of the conductor, and wherein the fine value is about one fifth of the determined width of the conductor.

13. The system of claim 11, wherein when the conductor is unassigned and has no other face that is differently marked, the instructions cause the processing unit to provide the mesh cells on the conductor backbone by providing the mesh cells on the conductor backbone further comprises setting the mesh cells to the fine value.

14. The system of claim 11, wherein when the conductor is unassigned and has another face that is differently marked, the instructions cause the processing unit to provide the mesh cells on the conductor backbone by:

setting the mesh cells to the coarse value when the differently marked face is marked as a power/ground conductor; and setting the mesh cells to the fine value when the differently marked face is marked as a signal conductor.

15. A non-transitory computer readable medium that stores instructions for determining an initial mesh for a conductor in a model of an electronic circuit design to enable more efficient simulation of electro-magnetic properties of the conductor that, when executed by one or more processors, cause the one or more processors to:

parse a three-dimensional representation of the conductor as a plurality of vertices of a closed polygon, each vertex joining corresponding edges of the polygon;

obtain a straight skeleton of the conductor by moving the edges inwardly toward a center of the polygon at a constant speed in a self-parallel manner, wherein the straight skeleton is a topological polygon representation of the conductor;

determine widths of the conductor at a plurality of points along the straight skeleton as a function of the edges moving inwardly at the constant speed;

construct a backbone of the conductor, including registering the widths of the conductor along the conductor backbone;

provide mesh cells on the conductor backbone using predetermined scaling factors of the registered widths of the conductor backbone; and generate the initial mesh for the conductor based on the mesh cells.

16. The non-transitory computer readable medium of claim 15, wherein the instructions further cause the one or more processors to:

identify vertices with corresponding edges that intersect under an acute reflex angle before moving the edges inwardly toward the center of the polygon; and split the identified vertices into sets of two or more closely spaced working vertices connected by an initially zero length edge abutting the acute reflex angle, respectively, to avoid creating points along the straight skeleton where widths of the conductor at the points are inaccurate.

17. The non-transitory computer readable medium of claim 16, wherein obtaining the straight skeleton of the conductor comprises initially setting each of the corresponding edges that intersects under the acute reflex angle to an infinitesimal edge.

18. The non-transitory computer readable medium of claim 15, wherein the instructions cause the one or more processors to provide the mesh cells on the conductor backbone by:

setting the mesh cells to a coarse value when a pin set is not on the conductor;

setting the mesh cells to the coarse value when the conductor is marked as a power/ground conductor; and setting the mesh cells to a fine value when the conductor is marked as a signal conductor.

19. The non-transitory computer readable medium of claim 18, wherein when the conductor is unassigned and has no other face that is differently marked, the instructions cause the one or more processors to provide the mesh cells on the conductor backbone by providing the mesh cells on the conductor backbone further comprises setting the mesh cells to the fine value.

20. The non-transitory computer readable medium of claim 18, wherein when the conductor is unassigned and has another face that is differently marked, the instructions cause the one or more processors to provide the mesh cells on the conductor backbone by:

setting the mesh cells to the coarse value when the differently marked face is marked as a power/ground conductor; and setting the mesh cells to the fine value when the differently marked face is marked as a signal conductor.

* * * * *